United States Patent
Han et al.

[19]

[11] Patent Number: 5,824,953
[45] Date of Patent: Oct. 20, 1998

[54] COAXIAL CONNECTOR FOR VACUUM CHAMBER FOR MICROWAVE AND MILLIMETER WAVE MEASUREMENT

[75] Inventors: Seok-Kil Han; Kwang-Yong Kang; Je-Ha Kim, all of Daejeon, Rep. of Korea

[73] Assignee: Electronics and Telecommunications Research Institute, Daejeon, Rep. of Korea

[21] Appl. No.: 708,682

[22] Filed: Sep. 5, 1996

[30] Foreign Application Priority Data

Dec. 26, 1995 [KR] Rep. of Korea ............ 95-56725

[51] Int. Cl.⁶ .................................................. H05K 9/00
[52] U.S. Cl. ............................................... 174/65 SS
[58] Field of Search ................. 174/65 SS, 151; 439/320

[56] References Cited

U.S. PATENT DOCUMENTS

| | | | |
|---|---|---|---|
| 2,972,002 | 2/1961 | Wayman | 174/65 |
| 4,251,680 | 2/1981 | Germann | 174/18 |
| 4,731,577 | 3/1988 | Logan | 324/158 F |
| 5,232,377 | 8/1993 | Leibfried, Jr. | 439/320 |
| 5,310,963 | 5/1994 | Kennelly | 174/65 SS |
| 5,410,102 | 4/1995 | Guiol et al. | 174/35 C |

*Primary Examiner*—Bot L. Ledynh
*Assistant Examiner*—Joseph Waks
*Attorney, Agent, or Firm*—Nixon & Vanderhye P.C.

[57] ABSTRACT

A coaxial connector for microwave and millimeter wave measurement can be used by attachment to a vacuum chamber for instrumentation when measuring a high frequency characteristic for various electronic devices at low temperature. The coaxial connector connects microwave instrumenting equipment to a device to be tested within vacuum chamber (e.g., so as to measure a low temperature and high frequency characteristic for a high frequency device). It includes a support plate for attachment to the vacuum chamber and a support screw to prevent the coaxial connector from rotating. The support screw is of hexagonal shape in the exemplary embodiment and is arranged to one side on the center of the support plate. A coaxial cable transmits the measured signal and is extended to pass through the center of the support plate and support screw, and a V-shape connector on each end of the cable for respectively coupling between a fixed sample stand in the vacuum chamber and the microwave instrument equipment.

7 Claims, 3 Drawing Sheets

COAXIAL CONNECTOR FOR VACUUM CHAMBER FOR MICROWAVE AND MILLIMETER WAVE MEASUREMENT

BACKGROUND OF THE INVENTION

1. Field of the Invention

The present invention generally relates to a coaxial connector, and more particularly, to a coaxial connector for microwave and millimeter wave measurement that can be attached to a vacuum chamber for instrumentation when measuring a high frequency characteristic at low temperature for various electronic devices.

2. Description of the Prior Art

Recently, due to advances in the electronic industry, there are many kinds of electronic devices for which it is necessary to evaluate the low temperature characteristics.

It is necessary to develop a coaxial connector which can reciprocally connect the terminal of measuring equipment such as a vector network analyzer and a measurement vacuum chamber so as to efficiently measure from microwave band to millimeter wave band high frequency characteristics at low temperature for electronic devices such as GaAs-MIMIC, active devices such as microwave SQUID, JOSEPHSON device, microwave transmitting line devices of microstripped high temperature superconductivity such as a resonator, various filters, couplers, etc.

However, reliability and durability are also required for the coaxial connector, because it is used for measuring frequency characteristics within the range of a millimeter wave above 30 GHz and a microwave below 30 GHz under low temperatures below $-250°$ C. and, high vacuum below $10^{-8}$ torr.

An SMA connector made by OmniSpectra Co. Ltd. of USA is available as a connector for vacuum chambers, however, there are problems in that its frequency range is limited within 18 GHz. It therefore cannot be used as a connector for measurement above 18 GHz in a vacuum chamber. It also has a high cost.

In addition, a V-connector made by Wiltron Co. Ltd. of USA is used as a connector which can be used at a high frequency of 60 GHz. However, there is a limitation in that it is not suitable to use the V-connector as a vacuum chamber connector because the dielectric between its connectors is air and, as a result, a vacuum state can be maintained.

Accordingly, there is a problem with conventional coaxial connectors needed to evaluate accurately the characteristics for a GaAs, high speed, high frequency device or a microstripped superconductivity transmitting line device of a low temperature microwave characteristic.

SUMMARY OF THE INVENTION

It is an object of the present invention to provide a coaxial connector which can obtain provide a good electronic match between the terminals of microwave instrumenting equipment and an instrumenting vacuum chamber at a high frequency region near the millimeter wave band and at a very low temperature and high vacuum so as to permit accurate evaluation of microwave and millimeter wave characteristics for a high speed and high frequency device. The novel connector of this invention also can be fabricated at low cost and can be easily attached to a low temperature vacuum chamber for measurement. It can make the required transition from measurement conditions in the vacuum chamber without overly attenuating a transmitting signal during measurements.

In another aspect of the present invention, a coaxial connector connects the terminal of microwave instrumenting equipment to a vacuum chamber for measurement to measure low temperature and high frequency characteristics for a high frequency device. Such coaxial connector includes a support plate for attachment to said vacuum chamber for measurement;

a support screw for preventing said coaxial connector from rotating when attached to said vacuum chamber, said support screw being of hexagonal shape and arranged to one side on the center of said support plate;

a coaxial cable for transmitting the measured signal, said cable being extended and passing through the center of said support plate and support screw; and V-shape connectors for respectively coupling a tooth formed structure of a fixed sample stand in said vacuum chamber and the terminal of said microwave instrumenting equipment, said V-shape connectors being arranged on both ends of said coaxial cable.

BRIEF DESCRIPTION OF THE DRAWINGS

The present invention will now be described with reference to the drawings attached only by way of example.

DETAILED DESCRIPTION OF PREFERRED EMBODIMENTS

Hereinafter, a preferred embodiment for a coaxial connector of the present invention will be described in detail with reference to the drawings attached.

Figure 1A:
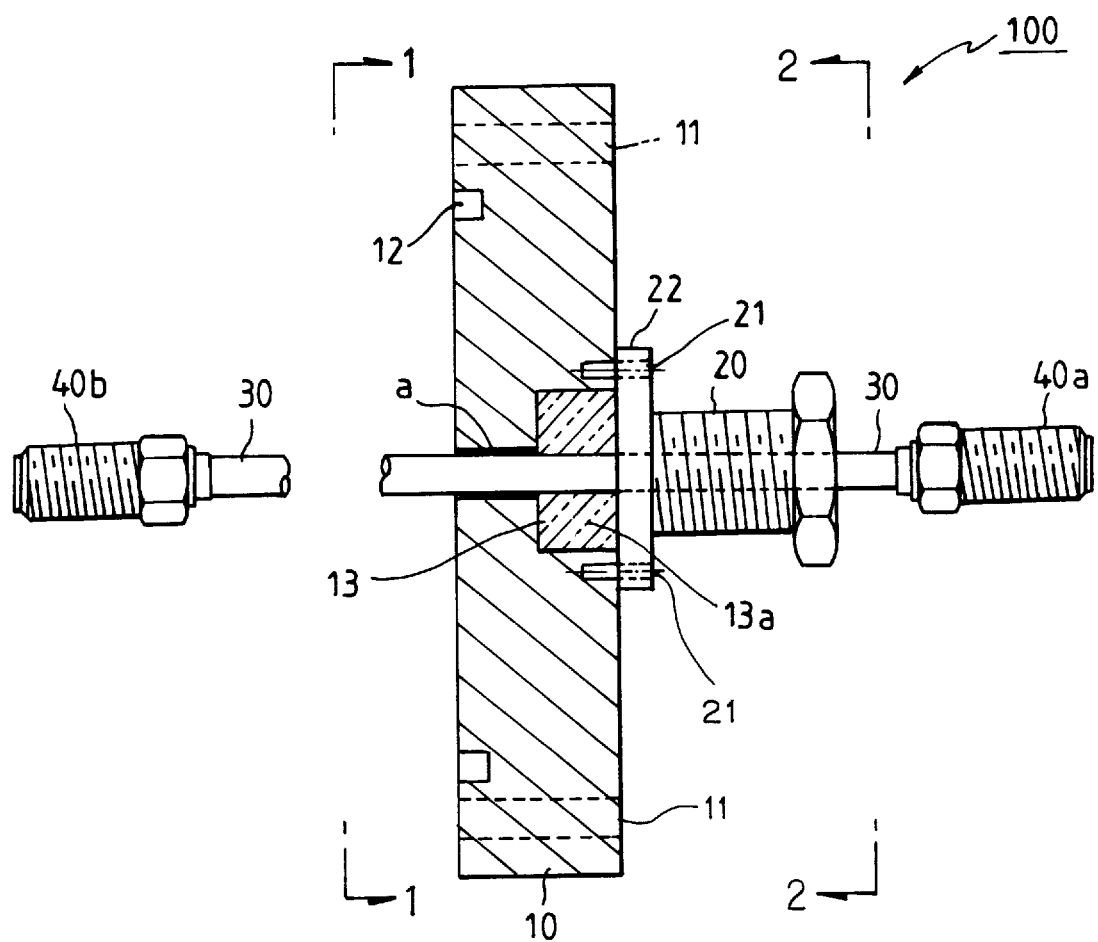
FIG. 1 is a plan view of a coaxial connector together with a partial sectional view of support plate for a coaxial connector according to the present invention.
FIG. 1B is a sectional view of a coaxial connector taken along the line 1—1 of FIG. 1A.
FIG. 1C is a sectional view of a coaxial connector taken along the line 2—2 of FIG. 1A.
Figure 1B:
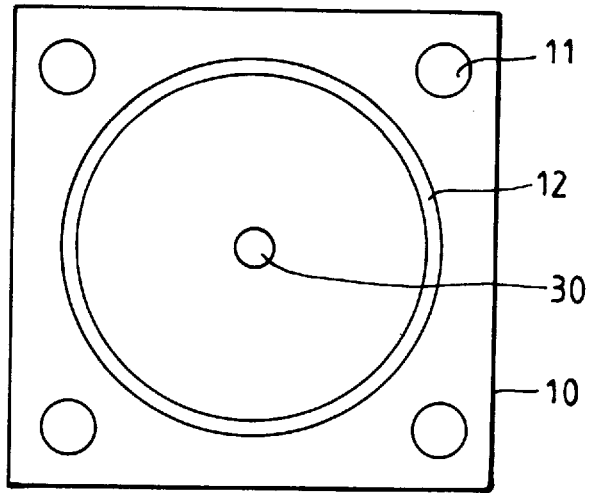
Figure 1C:
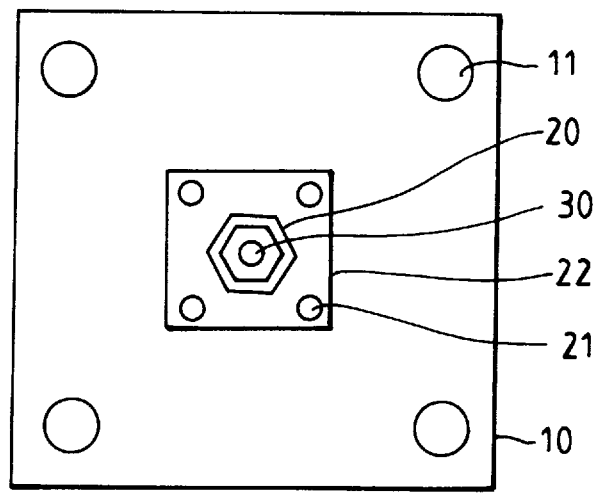

FIG. 1A is a plan view of a coaxial connector together with a partial sectional view of support plate for a coaxial connector according to the present invention, FIG. 1B is a sectional view of a coaxial connector taken along the line 1—1 of FIG. 1A, FIG. 1C is a sectional view of a coaxial connector taken along the line 2—2 of FIG. 1A.

As shown in FIGS. 1A through 1B, a coaxial connector 100 of the present invention comprises a support plate 10 for attachment to a vacuum chamber(not shown) for instrumentation, a screw 20 for preventing the coaxial connector from rotating when attached to the vacuum chamber, the screw being of hexagonal shape and fixed at one side at the center of the support plate 10, a coaxial cable 30 for transmitting measurement signals extended through the open hole in the center of the support plate and support screw 20, and V-connectors(40, 40) being fixed to both ends of the coaxial cable 30 and connected with the terminal of the microwave instrumenting equipment and a fixed sample die in the vacuum chamber.

At this time, there is used a V-connector usable to millimeter wave band(for example, V-100 male connector made in Wiltron Co. Ltd.) as the V-connector described above, a semirigid cable of copper or stainless steel as a coaxial cable 30, an Al support plate of a good flatness characteristic to maintain a high vacuum state when attached to a vacuum chamber.

The support screw 20 is affixed to the support plate 10 by a fixed means(not shown) inserted through screw holes 21 of flange 22 formed on one end thereof and is, hexagonal so as to be able to insert a part of a V-connector for preventing rotation of the coaxial connector 100 when affixing it to a vacuum chamber.

To obtain the perfect seal necessary to maintain a high vacuum state due to removing the interval between a coaxial cable 30 passing through the center of the support plate and a center hole of the support plate 10, typically, soldering or welding must be performed on the junction portion(a) reciprocally connecting the support plate 10 and coaxial cable 30. Because it is difficult to make the juncture of aluminum of a support plate material and phosphorus used in welding, under high temperature, the juncture between the support plate 10 and the cable 30 is welded. However, there is a problem in that it may causes the cable 30 to break-down.

To solve such problems, an epoxy sealing groove 13 is formed in the central portion of a side of the support plate 10. After the coaxial cable 30 is inserted through the central groove of the support plate 10, the coaxial cable is then connected by sealing with epoxy in the epoxy sealing groove 13. The juncture is effected at normal temperature, consequently, the coaxial cable 30 is seal-adhered to the support plate 10.

By means of the sealing-juncture process described above, since a vacuum state of $10^{-8}$ torr is maintained and a junction is performed at normal temperature and damage of coaxial cable 30 can be prevented, a good electronic matching can be obtained between the terminal of microwave instrumenting equipment and a vacuum chamber for instrumentation.

On the other hand, a plurality of coupling screw holes 11 are formed on the periphery of the support plate 10 so as to stably affix coaxial connector 100 to a vacuum chamber. Special coupling screws(not shown) are inserted into the coupling screw holes, is a circular O-ring inserting groove 12 on a surface of support plate 10 so as to maintain a vacuum state between coaxial connector 100 and the vacuum chamber wall, the O-ring (not shown) being inserted into the groove 12.

Figure 2A:
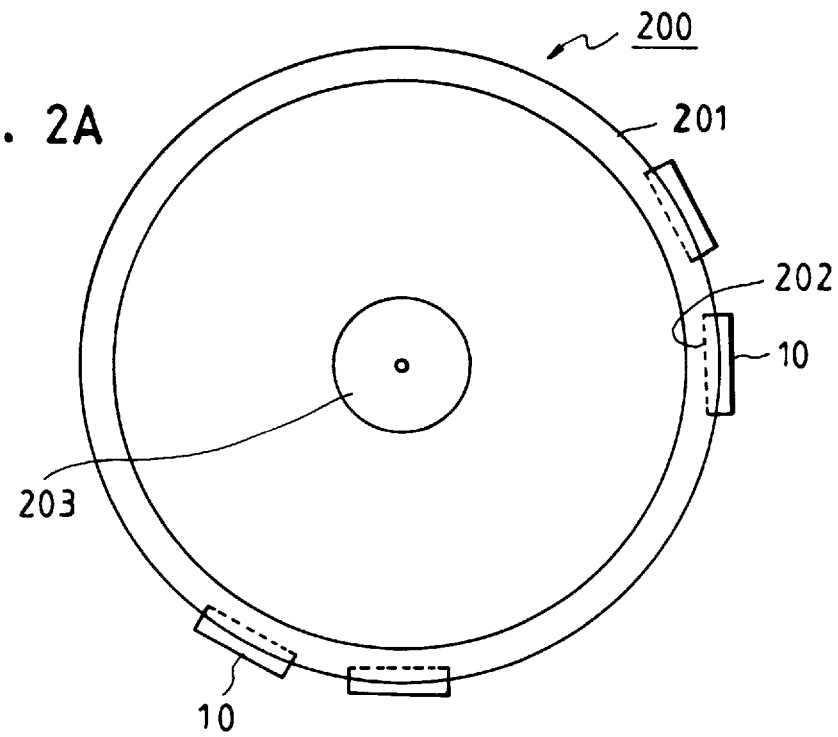
FIG. 2A is a plan view showing the attachment of a coaxial connector of the present invention to a vacuum chamber for a microwave and millimeter wave measurement.

FIG. 2A is a plan view showing coaxial connectors 10 of the present invention affixed to a vacuum chamber 200 for a microwave and millimeter wave measurement.

Figure 2B:
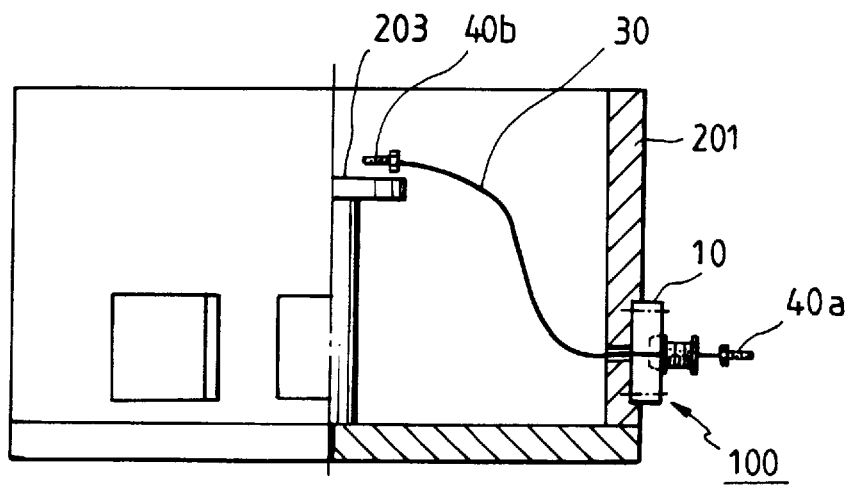
FIG. 2B is a partial front sectional view for FIG. 2A.

FIG. 2B is a partial front sectional view for FIG. 2A.

As shown in FIGS. 2A and 2B, a vacuum chamber 200 for typical instrumentation is composed of an exterior wall 201 of metal of a circular column and a fixed groove 202 for affixing a coaxial connector 100 is formed on the exterior wall 201. A fixed sample die 203 for a measuring sample(not shown) is formed on the inner center thereof with an arrangement of an extra cooler to be cooled to low temperature, and further an extra vacuum exhaust means.

At this time, the support plate 10 of the coaxial connector 100 is fixed to a coaxial connector fixed groove 202 of a vacuum chamber 200. One connector 40a of V-type connectors 40a 40b are arranged at opposite ends of the coaxial cable 30. One (40a) is associated with a terminal of the microwave instrumenting equipment, another connector 40b is connected to a structure formed on a fixed sample die 203 in the vacuum 200.

As described above, the coaxial connector of the present invention can obtain a good electronic matching between the terminal of microwave instrumenting equipment and an instrumenting vacuum chamber at high frequency regions near millimeter wave band and very low temperatures and high vacuums, and can accurately evaluate microwave and millimeter wave characteristics for a high speed and high frequency device because it can be fabricated at low cost and also easily affixed to a low temperature vacuum chamber for measurement, and can make this transition without unduly attenuating a transmitting signal when measuring.

The coaxial connector of the present invention can be efficiently used for a transmitting characteristic evaluation at the lowest temperature and also a super-high frequency band of DC to 60 GHz for a microwave and millimeter wave device. It can also be used for measuring from microwave bands to millimeter wave bands at a low temperature and high frequency characteristic for an electronic device such as GaAs-MMIC, an active device such as microwave SQIUD, JOSEPHSON device, a transmitting line device of microstripped high temperature, super-conductive microwave.

Although the present invention has been described above with reference to the preferred embodiments thereof, those skilled in the art will readily appreciate that various modifications and substitutions can be made thereto without departing from the spirit and scope of the invention as set forth in the appended claims.

What is claimed is:

1. A coaxial connector for connecting a terminal of microwave instrumenting equipment to a vacuum chamber for measurement of a low temperature and high frequency characteristic for a high frequency device, said coaxial connector comprising:

a support plate having a center adapted for attachment to said vacuum chamber;

a support screw for preventing said coaxial connector from rotating when affixing said coaxial connector to said vacuum chamber, said support screw being of a hexagonal shape and centered on one side of said support plate;

a coaxial cable for transmitting a measured signal, said cable being extended to pass through the center of said support plate and said support screw; and a connector on each end of said coaxial cable for respectively coupling a sample in said vacuum chamber and said microwave instrumenting equipment;

wherein an epoxy sealing groove is provided on said one side of said support plate at a central portion thereof.

2. The coaxial connector as in claim 1 wherein said coaxial cable is a semirigid cable made of copper or stainless steel.

3. The coaxial connector as in claim 1, wherein said coaxial cable is sealed to said support plate with epoxy in said epoxy sealing groove.

4. The coaxial connector as in claim 1 wherein said coaxial connector further comprises a circular O-ring inserting groove for receiving an O-ring thereinto disposed on one surface of said support plate.

5. A coaxial cable connector assembly comprising:

a support plate having structure for sealed attachment to a vacuum chamber and having a predetermined thickness with an aperture therethrough;

a coaxial cable having a length substantially greater than said support plate thickness and extending lengthwise through said aperture while being permanently sealed to the support plate therewithin;

first and second coaxial cable connectors, each being affixed to a respectively associated end of said coaxial cable;

said support plate having attachment screw holes distributed around said aperture; and said support plate also having an O-ring groove extending about said aperture on one side of the support plate.

6. A coaxial cable connector assembly as in claim 5 wherein said coaxial cable is a length of semi-rigid coaxial cable made of copper or stainless steel.

7. A coaxial cable connector assembly comprising:

a support plate having structure for sealed attachment to a vacuum chamber and having a predetermined thickness with an aperture therethrough;

a coaxial cable having a length substantially greater than said support plate thickness and extending lengthwise through said aperture while being permanently sealed to the support plate therewithin;

first and second coaxial cable connectors, each being affixed to a respectively associated end of said coaxial cable;

wherein said support plate aperture includes an epoxy sealing groove with epoxy therein permanently sealing said coaxial cable to said support plate.

* * * * *